United States Patent [19]

Dydyk

[11] 4,340,870
[45] Jul. 20, 1982

[54] EFFICIENT HIGHER ORDER MODE RESONANT COMBINER

[75] Inventor: Michael Dydyk, Scottsdale, Ariz.

[73] Assignee: Motorola, Inc., Schaumburg, Ill.

[21] Appl. No.: 172,587

[22] Filed: Jul. 28, 1980

[51] Int. Cl.³ .......................... H03B 7/14; H03B 9/14
[52] U.S. Cl. .............................. 331/56; 331/107 DP;
331/107 P; 331/107 C; 333/228; 333/230;
333/232
[58] Field of Search .................... 331/56, 96, 107 DP,
331/107 P, 107 C, 117 D; 330/287, 56;
333/219, 227, 228, 230, 232

[56] References Cited

U.S. PATENT DOCUMENTS

| 4,034,314 | 7/1977 | Dydyk | 331/56 X |
| 4,075,578 | 2/1978 | Dydyk | 331/56 |
| 4,143,334 | 3/1979 | Dydyk | 331/56 |
| 4,162,458 | 7/1979 | Dydyk et al. | 331/10 P X |
| 4,189,684 | 2/1980 | Hieber et al. | 333/228 X |

*Primary Examiner*—Siegfried H. Grimm
*Attorney, Agent, or Firm*—M. David Shapiro; Eugene A. Parsons

[57] ABSTRACT

An efficient higher order mode resonant combiner in which a higher order mode accumulator cavity is adjusted to have the real part of its input characteristic impedance to be so minimized as to be less than the characteristic impedance $Z_o$ of the input circuit. When an active device is matched to this low, minimized value of cavity input impedance a mismatch results between the active device power source and the input to the combiner at undesired higher order modal frequencies. This resultant mismatch at undesired modal resonances obviates the need for mode suppression devices within the cavity which devices as taught in the prior art had detrimental effect of the efficiency of the combiner. The input impedance at the desired modal resonant frequency is minimized by choice of input and output coupling coefficients and by utilization of a secondary resonant cavity spaced a predetermined distance from the primary accumulator cavity so as to present a virtual short circuit across the input line above said primary accumulator cavity so as to virtually eliminate the effect of a terminating stabilizing load, $Z_o$, in the input circuit.

22 Claims, 13 Drawing Figures

FIG 9

EFFICIENT HIGHER ORDER MODE RESONANT COMBINER

BACKGROUND

1. Field of the Invention

The invention relates to the field of power combining using cavity resonant devices. In particular the invention relates to the field of power combining using a resonant cavity which resonates in a higher order mode. More specifically the invention relates to a power combiner which utilizes two higher order mode resonant cavities neither of which requires mode suppressors thus providing a highly efficient device.

2. Prior Art

The most pertinent prior art known to me is that of three earlier patents granted to me and assigned to Motorola, Inc. of Schaumburg, Ill., the assignee herein.

In U.S. Pat. No. 4,034,314, I disclosed a microwave diode coaxial circuit oscillator which comprised an accumulating cavity, resonant in the dominant mode at the frequency $f_o$, and loaded by a centered output probe. An unloaded cavity, dominant mode resonant at $f_o$, was spaced a quarter wavelength from the accumulating cavity so as to appear as a virtual short circuit to $f_o$ energy which might not otherwise couple to the accumulating cavity and be lost in a terminating, stablizing load on the input coaxial line. Also disclosed was the use of an unloaded cavity, dominant mode resonant at twice $f_o$, spaced an integral number of quarter wavelengths from an active energy device (a negative resistance diode) at its resonant frequency of twice $f_o$. This second unloaded cavity provided a virtual short circuit or virtual open circuit to $2f_o$ energy at the active device to control loading at the second harmonic of $f_o$ and reduce noise output from the accumulator cavity. The manner in which a multiplicity of coaxial input circuits might be coupled to the accumulator cavity for purposes of combining power output of several active devices was also disclosed. The number of such coaxial input circuits which could be utilized with the accumulator cavity was obviously limited by the inherent size of a cavity resonator resonant in the dominant mode at $f_o$.

In U.S. Pat. No. 4,075,578, I introduced the concept of non-symmetrical input and output couplings to a dominant mode accumulator cavity to increase the number of energy circuits which might be coupled into and out of an existing dominant mode accumulator cavity. By locating output coupling devices at or near the cavity wall of the accumulator cavity much of the coupling mechanism may be located outside of the projection of the accumulator cavity wall, resulting in greater space availability within the cavity perimeter for additional coupling devices. As in my earlier patent, I provided a second non-loaded, dominant mode cavity, resonant at $f_o$, to stabilize operation and to reduce losses.

To further improve space availability for coupling device I introduced in U.S. Pat. No. 4,143,334 the use of a cavity enlarged to resonate at $f_o$ in a higher order mode. Because the accumulator cavity was enlarged to accommodate the higher order mode of resonance space was made available for more coupling devices. Once again I utilized a second cavity which was also resonant at $f_o$. However, unlike the accumulator cavity this second cavity was resonant in the dominant mode. As with my earlier teachings this second cavity was unloaded and spaced a quarter wavelength from the accumulator cavity to provide spurious-free and efficient operation.

A negative-resistance oscillator is an oscillator produced by connecting a parallel-tuned resonant circuit to a two-terminal negative-resistance device; that is, a device in which an increase in voltage results in a decrease in current. As a power source, the negative resistance device leaves much to be desired. In order to achieve reasonable power output levels from a negative resistance oscillator a plurality of such negative resistance active devices must be coupled to the resonant cavity.

Negative resistance devices, such as impact avalanche transit time (IMPATT) diodes are rich in frequency content by virtue of the large frequency bandwidth over which negative resistance can be obtained. While utilizing higher order mode resonant cavities, rather than dominant mode resonant cavities, provides a larger cavity with a greater surface area in which coupling devices may be incorporated, enlarging the cavity to permit higher order mode resonance in a negative resistance oscillator sets the stage for several resonances at frequencies other than the desired frequency of operation. Since the negative resistance energy source can output energy in many of these higher order mode resonant frequencies, the efficiency of the negative resistance oscillator at the desired frequency may be reduced if such extraneous resonances are permitted to be sustained.

The well known and well observed prior art teaching with respect to negative resistance oscillators utilizing dominant mode resonators was that the real part of the cavity input impedance should be maximized and the coaxial input circuit matched to this maximized cavity impedance. This would assure maximum gain at the frequency at which the real part of the cavity input impedance was maximized. For reference see N. D. Kenyon, "A Circuit Design For MM-Wave IMPATT Oscillators", 1970, *G-MTT Symposium Digest*, pages 300–303.

Unfortunately, when the prior art teaching is attempted with higher order mode resonators it is found that the real part of the input impedance to the cavity is maximized at several higher order mode resonant frequencies. In fact the input impedance at the desired modal resonant frequency is lower (due to output coupling) than the input impedance presented at modal resonant frequencies which it is desired to suppress.

The prior art has recognized this problem and after maximizing the real part of the cavity input impedance at the desired modal resonant frequency, designers have provided mode suppression means within the cavity to reduce the output of undesired modal resonant frequencies. However, this results in the loss of the energy contained in such suppressed modal resonant frequencies. Further, the Q of the cavity is adversely affected to the further detriment of oscillator efficiency.

It is therefore an objective of the invention to provide an efficient higher order mode, negative resistance oscillator and power combiner in which unwanted modal resonant frequencies are suppressed without detriment to the overall efficiency of the oscillator.

It is further objective of the invention to teach a new method for optimizing the real part of the input impedance of the higher order mode cavity resonator which will permit the negative resistance, active device to differentiate the desired modal resonant frequency from those which are undesired.

It is a specific objective of the invention to provide means and method for suppressing undesired modal resonant frequencies in an essentially loss-less manner.

SUMMARY OF THE INVENTION

A higher order mode negative resistance oscillator/combiner utilizes a primary resonant cavity, the real part of whose input impedance has been minimized so that its value is less than $Z_o$ of the stabilizing load terminating the input circuit. The real part of the input impedance of the cavity is first reduced by a judicious choice of input and output coupling coefficients. A secondary higher order mode resonant cavity is then introduced and spaced a distance from the primary accumulator cavity so as to present a virtual short circuit across the input line essentially obviating the effect of the terminating stabilizing load $Z_o$ as a determining factor of the input impedance of the cavity. So minimizing the input impedance at the desired modal resonant frequency provides an embodiment for an active negative resistance device in which the input impedance at the desired modal resonance is low while that impedance at all undesired modal resonances is very high. An equalizing network is provided which makes the input impedance at the plane of the cavity directly proportional to the output impedance of the active device. This matches the active device to the cavity at the desired modal frequency and results in a significant mismatch between the cavity and the active device at all undesired modal resonances. Thus energy output from the active device is inhibited at the undesired modal resonant frequencies and efficient operation results without the need for mode suppression devices within the cavity. A plurality of active devices may be coupled to the primary accumulator cavity and means are provided for achieving a high output coupling coefficient as is dictated by a number of active devices whose outputs are to be combined in the invention. No limit is placed upon the number of active devices which may be combined since, by proper choice of higher order modal resonant configuration the necessary surface area within the cavity to accommodate the desired number of input devices may be achieved. The invention is disclosed in a presently preferred embodiment utilizing the $TM_{020}$ mode of resonance.

DETAILED DESCRIPTION OF THE INVENTION

In accordance with the prior art, as exemplified in the Kenyon reference previously cited, a negative resistance oscillator was to be optimized by maximizing the real part of the input impedance of the resonant cavity. In a dominant mode resonant cavity this practice optimized conditions for the frequency rich negative resistance device to lock onto that resonance at which the real part of the cavity input impedance had been maximized. This practice however does not work satisfactorily with higher order mode resonant cavities.

Figure 1:
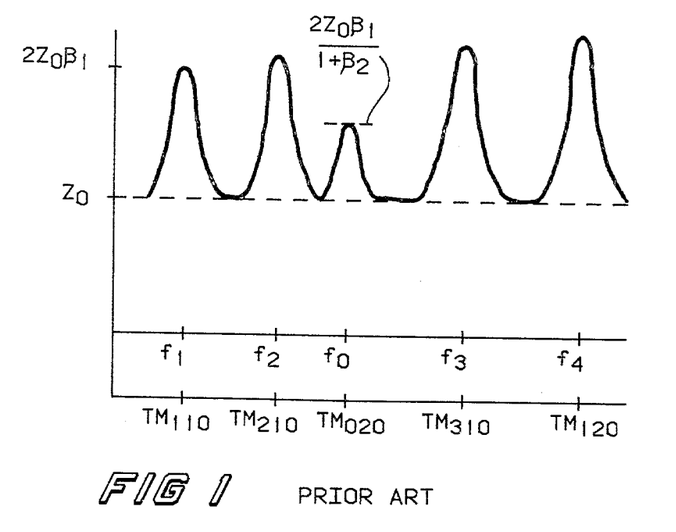
FIG. 1 is a plot of the real part of the input impedance of the higher order mode resonant cavity as a function of modal resonant frequency.

The input impedance of a resonant cavity in a negative resistance oscillator is controlled by proper selection of the relationship between the magnitudes of the input coupling coefficient through the cavity and the output coupling coefficient from the cavity. As those skilled in the art will recognize the relationship of input coupling coefficient, $\beta_1$, to the magnitude of the output coupling coefficient, $\beta_2$, actually depends upon this selection of the ratio $2Z_o\beta_1/(1+\beta_2)$. When conventional control of the relationship of $\beta_1$ and $\beta_2$ are exercised in a multi-mode resonant cavity the real part of the input impedance may be represented graphically as shown in FIG. 1. Assume that it is desired to produce a negative resistance power combiner oscillator in which the energy output of a plurality of negative resistance devices is to be combined into a single output coupling mechanism. Assume further that the desired output power is such as to make it impractical to couple a sufficient number of active devices to a dominant mode resonant cavity as would be necessary to achieve the desired combined power output. That is to say, a larger cavity is required to accommodate the number of input coupling mechanisms which will be required to achieve the levels of output power desired. Consider that a cavity which will support the $TM_{020}$ modal resonant frequency $f_o$ will provide sufficient surface area to accommodate the requisite number of input coupling devices necessary to achieve the required output power. The characteristics of such a higher order modal resonant oscillator will be disclosed first upon consideration of its characteristics when only a single input coupling mechanism and a single output coupling mechanism are employed. Those skilled in the art will readily conceive and understand the extension of the teachings herein to modal resonant oscillators/combiners having a plurality of input coupling mechanisms.

A designer, following prior art practices, would adjust the $\beta_1$ to $\beta_2$ relationship so as to maximize the real part of the input impedance of the cavity at the resonant frequency $f_o$ which, in the example chosen, is the $TM_{020}$ modal resonant frequency. It should be pointed out here that, while the $TM_{020}$ model resonance has been chosen for exposition, the teachings herein are not limited to any one model resonant configuration. The $TM_{020}$ mode, and other $TM_{0n0}$ (where n is greater than 2) however, do offer decided advantages over that of other modal configurations which may be supported within the cavity. The $TM_{0n0}$ modes are symmetrical in their field configurations about the center of a cylindrical resonant cavity. A coupling probe located at the center of such a cavity will couple to the $TM_{0n0}$ modes without coupling to other modal resonant configurations. Thus, tuning and output coupling mechanisms may be optimally located at the center of such a resonant cavity.

In accordance with prior art practices the real part of the input impedance of the higher order mode resonant cavity resulting from said practices may be graphically presented as shown in FIG. 1. It is noted that four other modal resonant frequencies exist within an octave bandwidth around the region of $f_o$. These modal resonant frequencies, $f_1$ through $f_4$ are resonant in the modal configurations as indicated in FIG. 1. It is not possible to maximize the input resistive component of the cavity at the $f_o$ modal resonant frequency by selecting the magnitudes of $\beta_1$ and $\beta_2$. In fact, because the output coupling mechanism (probe) is only sensitive to the $f_o$ modal resonant frequency, the input resistive component will be minimized as shown in FIG. 1. Thus, the negative resistance device will be emplaced in an environment wherein it may output energy to several or all of the possible modes of resonance of the higher order mode cavity. Energy output from the negative resistance device to undesired modal resonances results in effectively reducing the energy available at the desired modal resonance and thus the efficiency of the device is limited. It is desired that the environment in which the negative resistance device is emplaced shall be adjusted so as to encourage the output of energy by the active device at the desired modal resonant frequency $f_o$ while inhibiting the output of energy from the active device at undesired modal resonant frequencies.

Figure 2:
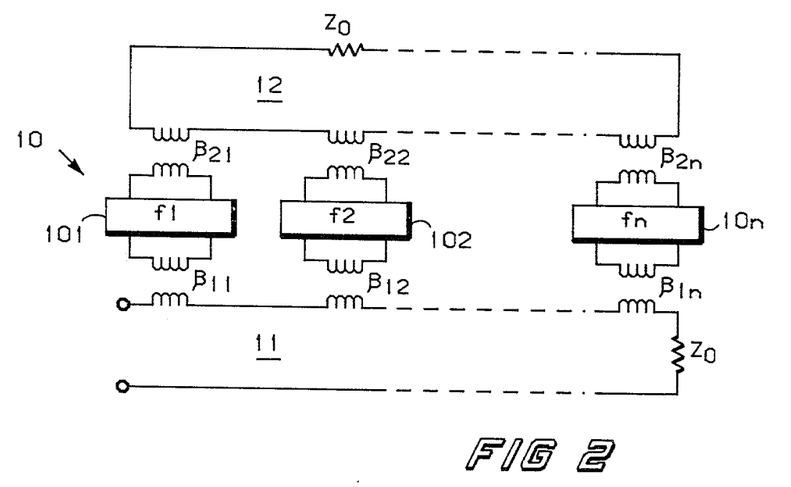
FIG. 2 is an equivalent circuit of a higher order modal resonance negative resistance oscillator such as would be exemplified by the impedance curves of FIG. 1.

The negative resistance oscillator considered to this point is one which has an input circuit coupled to a higher order mode resonant cavity which will support several modal resonant configurations therein, and an output coupling mechanism for extracting energy from said cavity and coupling same to a load. A negative resistance oscillator such as would give rise to the impedance plot of FIG. 1 is represented by the equivalent circuit of FIG. 2. Here the higher order modal resident cavity 10 is represented as a plurality of resonant cavities 101, 102 through 10n each supporting a modal resonant frequency $f_1$, $f_2$ through $f_n$ respectively. It should be remembered that although cavity 10 may be characterized as a plurality of resonant cavities, as shown in FIG. 2, in reality only one single multi-mode cavity is present in the device here under consideration. An input circuit 11 is coupled to the representative modal cavities 101 through 10n through coupling mechanism represented by the reference $\beta_1$. The second subscript indicated, for example $\beta_{1n}$ refers the coupling coefficient to the particular modal resonant cavity in question. Thus, $\beta_{1l}$ refers to the input coupling coefficient of representative cavity 101 which has a modal resonance at frequency $f_1$.

The representative cavities 101 through 10n are coupled to an output circuit 12 by output coupling mechanisms designated generally as $\beta_2$, the magnitude of the output coupling coefficient. As with $\beta_1$, the magnitude of the input coupling coefficient, discussed above, a second subscript 1 through n is added to associate the output coupling in question with a particular modal reference resonant cavity 101 through 10n. Thus it is seen, that energy coupled into the input circuit 11, as for example from a negative resistance active device, not shown, will be coupled to cavity 10 which may support modal resonant frequencies $f_1$ through $f_n$. Only the energy contained within the $f_o$ modal resonant configurations is coupled via $\beta_2$ to output circuit 12 for transmission to a load $Z_o$. It may be noted that input circuit 11 is terminated in a stabilizing load $Z_o$ as well.

The fact that a higher order mode resonant cavity will support several modal resonant configurations is well known to the prior art. To suppress the undesired modal frequencies the prior practice has been to incorporate mode suppression mechanisms within the cavity itself. Such mode suppression devices act upon the electric field of the undesired modal configuration thus dissipating by lossy means the energy contained within the undesired modal configurations. Unfortunately, such lossy mode suppression mechanisms detrimentally affect the Q of the cavity and further degrade the efficiency of the oscillator.

The teachings herein are diametrically opposed to prior art rules. Rather than choosing the relationship between input and output coupling coefficients $\beta_1$ and $\beta_2$ so as to maximize the real part of the cavity input impedance, the invention teaches that the real part of the cavity input impedance shall be minimized at the desired modal resonant frequency. When this is done the impedance plot of FIG. 3 is representative of the resistive component of cavity input impedance at the various modal resonant frequencies.

Figure 3:
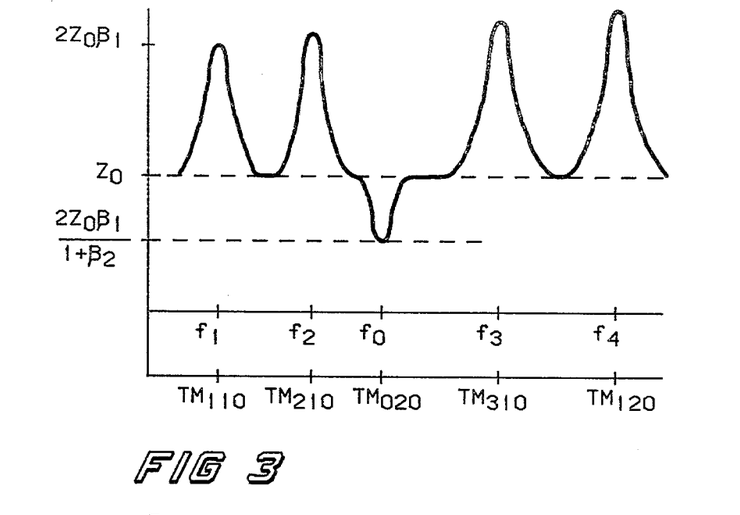
FIG. 3 is a plot of the real part of the input impedance of a higher order modal resonant negative resistance oscillator versus modal resonant frequency wherein the relationship of the input and output coupling coefficients in the resonant cavity have been adjusted to minimize the real part of the cavity input impedance at the selected modal resonant frequency $f_o$ in the $TM_{020}$ mode.
Figure 4:
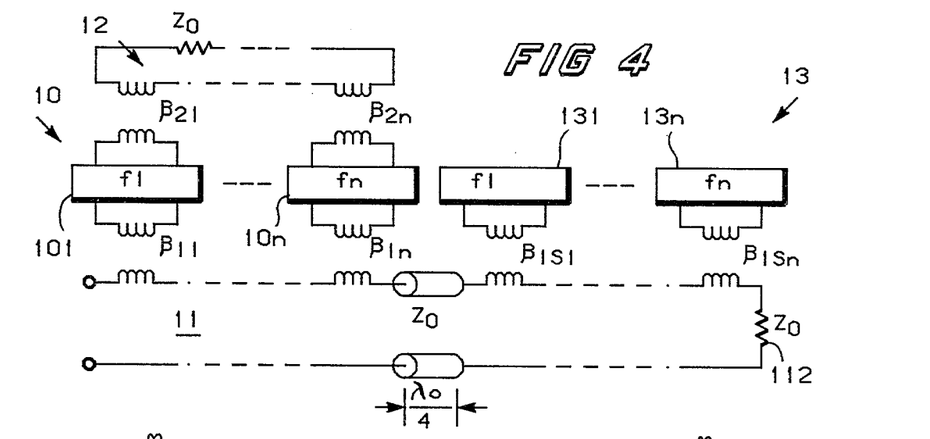
FIG. 4 is the equivalent circuit of a second higher order modal resonant negative resistance oscillator having a second higher order modal resonant cavity coupled to the input line a quarter wavelength removed from the original, higher order modal resonant accumulator cavity in the circuit of FIG. 2.

It will be readily apparent to those skilled in the art that the minimized value of the real part of the input impedance of the cavity as set forth graphically in FIG. 3 will not be realizeable merely from the adjustment of the relationship between input and output coupling coefficients $\beta_1$ and $\beta_2$. As FIG. 2 indicates, the input impedance of the device includes the input impedance of cavity 10 in series with terminating stabilizing load $z_o$. Thus the input impedance to the device shown in FIG. 2 must always exceed the impedance of the stabilizing load $Z_o$. In the presentation of FIG. 3 the real part of the input impedance of the circuit has been indicated as being a value less than $Z_o$. In order to accomplish this it is necessary to divorce the cavity input impedance from the effect of the terminating load $Z_o$. To achieve this, the equivalent circuit of FIG. 4 is suggested. Here a higher order mode resonant cavity 13 is coupled to input circuit 11 and is represented by a plurality of cavities each resonant at a particular modal resonant frequency.

Secondary cavity 13 is unloaded as indicated by the absence of any output coupling mechanisms. The input coupling mechanism between input circuit 11 and cavity 13 is indicated by input coupling coefficients $\beta_{1S1}$ through $\beta_{1Sn}$. A length of transmission line of characteristic impedance $Z_o$ having a length electrically equal to a quarter wavelength at the desired modal resonant frequency separates the top wall of cavity 10 from the bottom wall of cavity 13. Since cavity 13 is unloaded its impedance at the desired modal resonant frequency $f_o$ will be maximum. When this maximum input impedance is rotated down the input circuit 11 toward cavity 10 through the electrical equivalent of a quarter wavelength, a virtual short circuit results in the plane of the top wall of cavity 10 and across input circuit 11. Thus the input impedance as seen at the input to input circuit 11 is essentially only the input impedance of cavity 10. Thus, secondary cavity 13 acts in cooperation with the judicial choice of input and output coupling coefficients to provide an input impedance at the desired modal resonant frequency $f_o$ which is less than the value of the terminating stabilizing load 112.

At the same time the magnitudes of the real part of the input impedance to the cavities at the undesired modal resonant frequencies are enhanced and further maximized beyond the values that would occur had the conditions of FIG. 1 prevailed.

When an active device, such as a negative resistance diode, is matched to the input of the circuit of FIG. 4 at the desired modal resonant frequency $f_o$ it will be matched to the minimized input impedance for optimum transfer of energy at the desired modal resonant frequency. On the other hand the match between active device and cavity at undesired modal resonant frequencies will be such as to inhibit the transfer of energy between the active device and the cavity. This inhibition of output of energy from the active device at undesired modal resonances effectively increases the energy available at the desired modal resonant frequency $f_o$. The embodiment requires no modal suppression such as utilized in the prior art which results in the increase in losses and reduction in efficiency associated with such devices.

In U.S. Pat. No. 4,143,334 I utilized an enlarged higher order mode resonant cavity as the accumulator cavity and a smaller dominant mode resonant cavity to increase efficiency and suppress spurious modal oscillations. When multiple input lines were provided to accommodate a plurality of active negative resistance devices, I disclosed the use of a separate such dominant mode cavity on each of the plurality of input lines coupling to the higher order mode accumulator cavity. While this provided for ease in adjusting each of the individual negative resistance active devices to the desired operating frequency so that the performance of the combiner might be optimized the actual power combining became difficult because of the high Q of each individual active device module having such a second dominant mode resonant cavity. The teachings herein are therefore that a single, unloaded, higher order mode resonant cavity shall be introduced to improve the efficiency and frequency control of the invention. The concept of such a common second resonant cavity to which all input circuits were coupled was introduced in my U.S. Pat. No. 4,034,314. In the present instance however the second cavity is a higher order mode resonance cavity providing increased surface area to permit coupling to a greater number of negative resistance active devices.

Design considerations will now be considered to aid those skilled in the art in the practice of the invention. Network theory provides that, with an accumulator cavity and a second unloaded cavity coupled to input line 11 the real part of the input resistance may be expressed as $$R_{in} = \frac{2Z_o \beta_1}{1 + \beta_2} + \frac{Z_o}{1 + 2\beta_{1s}} \tag{1}$$

The expected insertion loss may be determined by use of the expression:

$$IL = 10 \log_{10}\left[2\beta_1 + \frac{1 + \beta_2}{1 + 2\beta_{12}}\right]\left(\frac{1 + \beta_2}{2\beta_1\beta_2}\right) \tag{2}$$

It is important to realize at this point that we have imposed a specific restraint upon the design of the invention in that we have chosen input and output coupling coefficients $\beta_1$ and $\beta_2$ so as to minimize the real part of the input impedance. As will be seen in FIG. 3 the imposition of this condition may be set forth as:

$$R_{in} < Z_o \tag{3}$$

In terms of fabrication of the higher order modal resonant oscillator, it would simplify matters if the input coupling coefficient to the secondary cavity $\beta_{1s}$ were equal to the input coupling coefficient to the accumulator cavity $\beta_1$. Assuming this as a desirable constraint and wishing to minimize the insertion loss of the device, examination of equation (2) dictates that $\beta_1$ shall be very large in order to minimize power dissipated in stabilizing load 112.

Since $\beta_1$ must be large and $R_{in}$ must be small, equation (1) indicates that $\beta_2$, the output coupling coefficient of the coupling mechanism extracting energy from accumulator cavity 10 must also be large. A large output coupling coefficient $\beta_2$ is readily realized when only one negative resistance active device is coupled to accumulator cavity 10. However where a plurality of active devices are to be coupled into the accumulator cavity the output coupling coefficient must be increased in accordance with the number of active devices coupled into the cavity. If the output coupling coefficient required to couple a unitary active element to accumulator cavity 10 is designated $\beta_{2u}$, and a number of active devices N are to be coupled to accumulator cavity 10 for purposes of combining output power of all such active devices, then the required output coupling coefficient between accumulator cavity 10 and output circuit 12 may be defined as $\beta_{2N}$ which is related to the unitary output coupling coefficient as follows:

$$\beta_{2N} = N(1 + \beta_{2u}) - 1 \tag{4}$$

If the modal resonant frequency oscillator disclosed herein is to be efficiently utilized as a power combining device means for achieving a high output coupling coefficient $\beta_{2N}$ within the constraints of equation (4) must be derived. Should the constraint of equation (4) make it impossible to realize a large enough output coupling coefficient $\beta_{2N}$ then the condition that the input coupling coefficients $\beta_{1s}$ and $\beta_1$ shall be equal must be re-evaluated.

Figure 5:
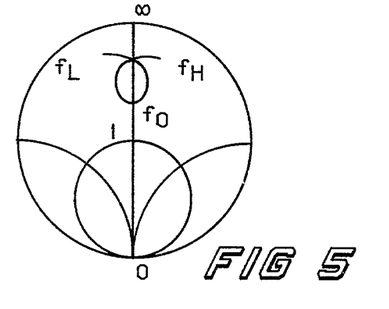
FIG. 5 is an impedance plot of the input impedance of the two cavity modal resonant oscillator of FIG. 4 wherein the input coupling coefficients to the second, unloaded cavity is significantly larger than the input coupling coefficient to the primary, accumulator resonant cavity.
Figure 6:
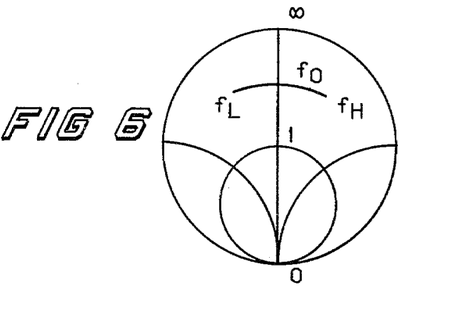
FIG. 6 is an impedance plot of the input of the higher modal resonant oscillator of FIG. 4 and FIG. 5 resulting from a proper choice of output coupling coefficient in the primary, accumulator resonant cavity of the oscillator of FIG. 4.

When it is impossible to realize a sufficiently large output coupling coefficient $\beta_{2N}$ it becomes necessary that the input coupling coefficient $\beta_{1s}$ of the secondary, unloaded resonant cavity 13 shall be larger than the input coupling coefficient $\beta_1$ of accumulator cavity 10. When cavity 13 is more tightly coupled to input line 14 than is accumulator cavity 10, a plot of the input impedance as presented in FIG. 5 results. Three resonances are observed with the real part of the input impedance of the cavity varying with the particular modal resonant frequency. Under such conditions the oscillator will exhibit frequency switching and significant output power gyrations as a function a frequency. The loading effect brought about by the magnitude of the output coupling coefficient $\beta_2$ may be utilized to cause only one resonance which would occur at the desired modal resonant frequency $f_o$. This is achieved by selecting $\beta_2$ such that $$\beta_2 = 1 + 2\beta_{1s}\sqrt{\frac{\beta_1}{\beta_{1s}} - 1} \tag{5}$$

If a realizeable design is to be achieved, some constraint must be placed on the realizeable relationship between $\beta_{1s}$ and $\beta_1$. Since the invention will lend itself for use as a power combiner it will be desirable that both the accumulator cavity 10 and secondary cavity 13 shall have the same diameter which will facilitate coupling of each resonator to a plurality of common input circuits 11. With the diameters of the cavities constrained to be equal in dimension recourse may be had with respect to the height of the cavities to establish the relationships between the two input coupling coefficients. As those skilled in the art will recognize, the height of a cylindrical resonant cavity is seldom permitted to exceed one-eighth of a wavelength at the desired modal resonant frequency. This constraint is imposed to inhibit the possibility of exciting additional higher order mode resonances and to minimize inductive discontinuities resulting from coupling the cavity to the input circuit. Increasing the height of the cavity has the effect of increasing the input coupling coefficient. With the height of secondary cavity 13 constrained to be one-eight of a wavelength at the desired modal resonant frequency a practical limitation on height ratio of secondary cavity 13 and accumulator cavity 10 is considered to be a 2:1 ratio of cavity heights. In terms of input coupling coefficient having the height of cavity 13 twice that of accumulator cavity 10 indicates that:

$$\beta_{1s} = 4\beta_1 \tag{6}$$

Utilizing equations (1), (5) and (6) the explicit value of the input coupling coefficient $\beta_1$ of accumulator cavity 10 may be determined as $$\beta_1 = \frac{1 - R_{in}/Z_o}{4(2^{R_{in}/Z_o} - 1)} \tag{7}$$

The denominator of equation (7) indicates further that $$2^{R_{in}/Z_o} > 1 \tag{8}$$

as a further constraint upon the design of the invention.

Figures 10, 11, 12, 13:
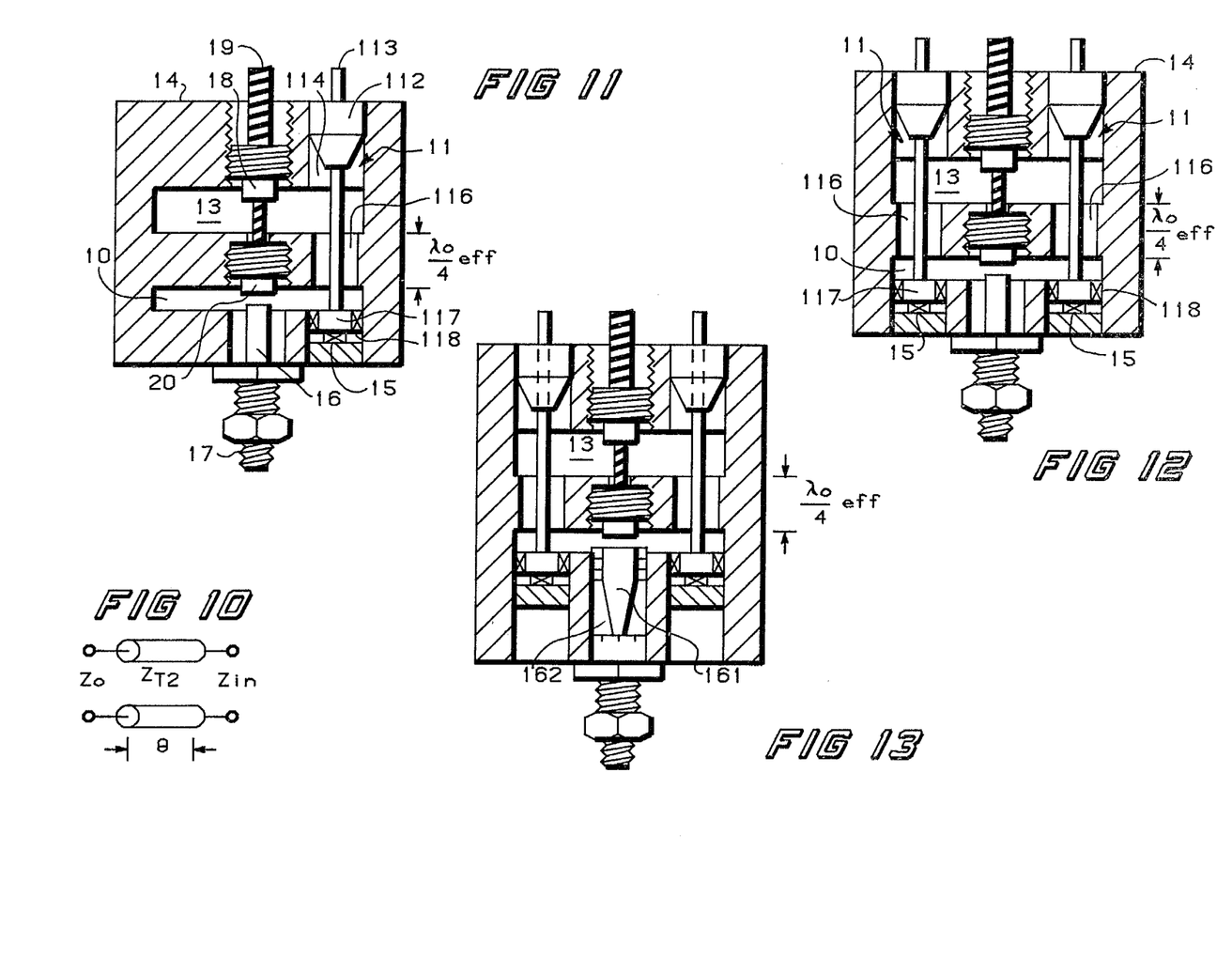
FIG. 10 is an equivalent circuit of the impedance transformation to be considered in matching the impedance of the negative resistance device, $Z_d$, to the input impedance $Z_{in}$ at the input to the modal resonant combiner.
FIG. 11 is a cross-sectional view of a presently preferred embodiment of a two cavity higher order modal resonant, negative resistance oscillator which utilizes the teachings set forth herein.
FIG. 12 is a cross-sectional view of a modal resonant oscillator such as that of FIG. 11 adapted to be coupled to a plurality of negative resistance devices so as to effectively combine the energy contributed by each of said negative resistance devices in the output coupling mechanism of said oscillator/combiner.
FIG. 13 is a cross-sectional view drawn to suggest either of the higher order modal resonant oscillators of FIG. 11 or FIG. 12 and having improved output coupling means for achieving unusually high values of output coupling coefficient such as may be required when combining the energies of a plurality of negative resistance active devices.

Before further refining the details of the equivalent circuit of the invention, it might be well to consider a physical embodiment of the invention as shown in the cross-sectional view of FIG. 11. The invention is comprised of a body 14 having the necessary conductive surfaces to provide input and output circuitry and to support modal resonant configurations within the two cavities. Input circuit 11 is comprised of a coaxial transmission line having an inner conductor 113 with an outer conductor 114 within which center conductor 113 is coaxially implaced. Center conductor 113 also passes through a portion of the accumulator cavity 10 and a portion of the secondary cavity 13. In this manner energy conveyed along input circuit 10 will be coupled into cavities 10 and 13. In input circuit 11 center conductor 113 and outer conductor 114 comprise a coaxial transmission line. In principle it would be possible to couple input circuit 11 to cavities 10 and 13 without perturbing the matched impedance characteristics of the line. Unfortunately discontinuities are introduced by the coupling of input circuit 11 to cavities 10 and 13.

In FIG. 11 it will be noted that the outer conductor 114 of input circuit 11 experiences a significant change in diameter as center conductor 113 passes through each of cavities 10 and 13. Such an abrupt change in outer conductor diameter contributes capacitive discontinuities into the impedance matched characteristics of the line. The distance traversed by the center conductor in its passage through each cavity will introduce inductive discontinuities proportional to that length, that is to say, proportional to the height of each cavity.

Experimental evaluation has shown that the discontinuities introduced by the input coupling mechanism are of sufficient magnitude to adversely affect the efficiency of the oscillator/combiner. It is therefore mandatory that their effect be eliminated if at all possible or at any rate their reaction must be minimized.

Figure 7:
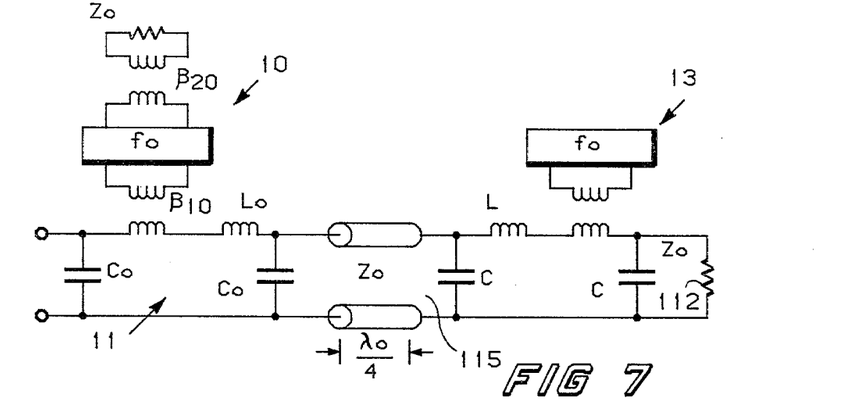
FIG. 7 is a more detailed equivalent circuit of the modal resonant oscillator than that of FIG. 4 in that it includes the discontinuities introduced in the input circuit as a result of coupling that circuit to both cavities.

The inductive and capacitive discontinuities introduced as a result of coupling input circuit 11 to accumulator cavity 10 and secondary cavity 13 are included in the equivalent circuit of FIG. 7. As center conductor 113 passes through cavity capacitive discontinuities $C_o$ are introduced as well as the inductive discontinuity $L_o$. As center conductor 113 passes through secondary cavity 13 discontinuities L and C are introduced. The section of transmission line 115 which separates cavities 10 and 13 while physically being a quarter wavelength long at the desired modal resonant frequency no longer provides an electrical separation of a quarter wavelength at that desired frequency due to the inductive and capacitive discontinuities introduced in coupling cavities 10 and 13 to input circuit 11. Since cavities 10 and 13 are no longer separated electrically by a quarter wavelength path at the desired frequency $f_o$ the virtual short across the input circuit will be impaired and energy may be dissipated in stabilizing load 112 which terminates input circuit 11. Further displacement of the virtual short could disturb the operation of accumulator cavity 10 and have a detrimental effect on the efficiency of operation of the device.

Since both the accumulator cavity 10 and secondary cavity 13 are identical in diameter, discontinuities C and $C_o$ will be identical. Further, since the height of cavity 13 is twice that of cavity 10, inductive discontinuity L will be equal to twice that of $L_o$. That is to say $$L = 2L_o;\ C = C_o \tag{9}$$

Figure 8:
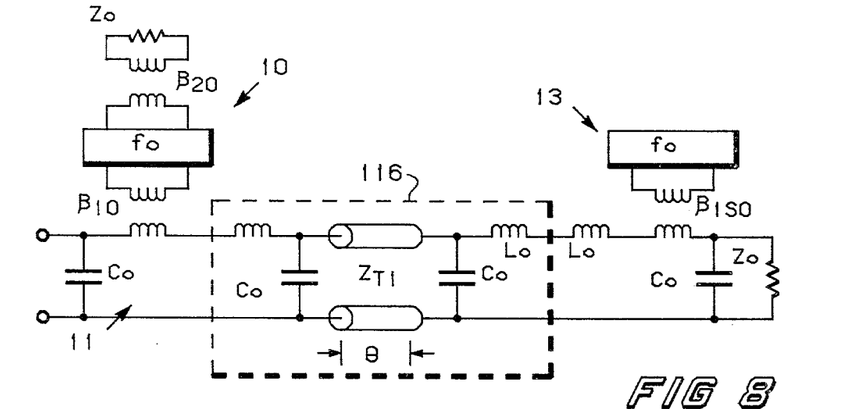
FIG. 8 is a redrawing of the equivalent circuit of FIG. 7 in which equivalent discontinuities have been provided with like references and an impedance transformer of a specific length is suggested as a means for eliminating or minimizing the affects of cavity coupling discontinuities.

The equivalent circuit of FIG. 7 has been redrawn as FIG. 8 to illustrate the identities set forth in equations (9). The transmission line of input circuit 11 in the region between cavities 10 and 13 has been placed in a broken line enclosure reference 116. Enclosure 116 contains discontinuities $L_o$ and $C_o$ as well as a portion of transmission line of characteristic impedance $Z_{t1}$ having an electrical length $\theta$. It should be possible to provide this portion of transmission line with reactive impedance $Z_{t1}$ and to select a proper electrical length $\theta$ so as to eliminate the effects of discontinuities $L_o$ and $C_o$. This may be done by selecting length $\theta$ as follows:

$$\theta = \sin^{-1} Y_o \left[ \frac{1 - 2\omega^2 L_o C_o}{(\omega C_o)^2 Z_{t1} + Y} \right] \tag{10}$$

establishing a reactive impedance $Z_{t1}$ as defined in the following expression:

$$Z_{t1} = Z_o \sqrt{\frac{1 - (\omega L_o/Z_o)^2}{(1 - \omega^2 L_o C_o)^2 - (\omega C_o Z_o)^2}} \tag{11}$$

Figure 9:
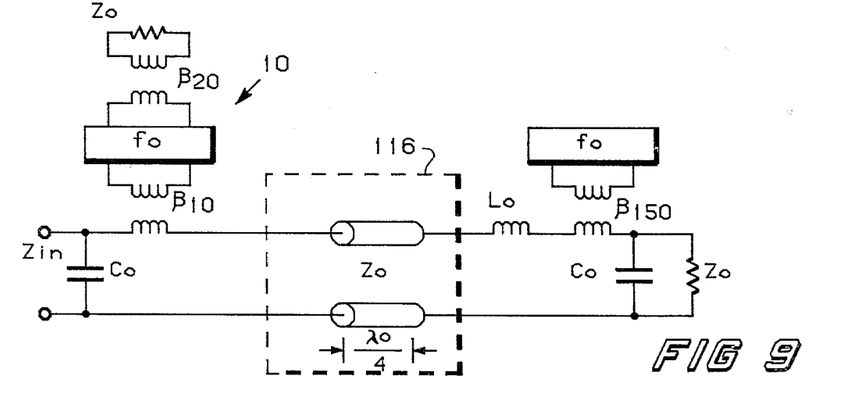
FIG. 9 is an equivalent circuit of the circuit of FIG. 8 illustrating the effect of the proper choice of impedance transformation in the circuit of FIG. 8 whereby the detrimental effect of most of the coupling discontinuities of FIG. 8 have been eliminated.

The effect of this transformation is illustrated in FIG. 9 wherein the enclosure 116 is depicted as effectively enclosing a portion of line of characteristic impedance $Z_o$ and of electrical length equivalent to a quarter wavelength at the desired modal resonant frequency $f_o$. While not all of the coupling discontinuity effects have been eliminated by the introduction of impedance transformer section $Z_{t1}$, those which most detrimentally increase the effective resistance of the stabilizing load so as to increase the insertion loss of the device have been eliminated.

Since some coupling discontinuities still remain the input impedance $Z_{in}$ will be complex as represented by the following equation.

$$Z_{in} = R_{in} \pm iX_{in} \tag{12}$$

The complex input impedance $Z_{in}$, defined in equation (12), will have to be considered in synthesizing an equalizing network which will satisfy oscillating conditions between the active energy source and the input to the two cavities. The choice of equalizing network is not a trivial matter. Conventional impedance transformation devices, such as quarter wavelength transformers, would provide an impedance match at the input to the combiner which is inversely proportional to the impedance at the output of the active energy device. To satisfy oscillating conditions between the active device and the input to the two cavities it is necessary that that equalizing network shall be one in which the output impedance of the active device shall be directly proportional to the input impedance of the input circuit at the plane of the accumulator cavity. The equalizing network of FIG. 10 is suggested as a preferred embodiment which satisfies the stated oscillating conditions. A length of transmission line of characteristic impedance $Z_{t2}$ and electrical length $\phi$ is provided. The characteristic impedance $Z_{t2}$ and the electrical length $\phi$ are defined by the relationships $$Z_{t2} = \sqrt{R_D R_{in} \pm X_o X_{in} + \left(\frac{X_D \pm X_{in}}{R_{in} - R_D}\right)(\pm R_D X_{in} - X_D R_{in})} \tag{13}$$

wherein the impedance $Z_D$ of the active energy source is defined as:

$$Z_D = -R_D + iX_D \tag{15}$$

The resultant equalizing network is represented in FIG. 11 by center conductor 117 and dielectric support 118.

A review of the structural development and its relationship to electrical performance to this point in the disclosure will be beneficial. The device of the invention is first depicted structurally in FIG. 11 wherein a body element 14 encloses a coaxial input circuit 11 which has a center conductor 113 and an outer conductor 114. Input circuit 11 is provided with a stabilizing, terminating load 112 of characteristic impedance $Z_o$. The active energy device 15 is coupled to input circuit 11 through the equalizing network comprised of low impedance center conductor 117 and dielectric support 118. Center conductor 113 passes through accumulator cavity 10 and secondary cavity 13 and coupled energy to the resonant modal configurations supported within said cavities. The location of the center conductor within the cavities determines the input coupling coefficient. Since no E-field exists at the sidewall of the cavities, the coupling coefficient tends to decrease as center conductor 113 is moved closer to the sidewalls of cavities 10 and 13, and tends to increase as center conductor 113 is moved away from the sidewalls. Of course, as center conductor 113 is moved past a peak in the E-field structure of the resonant modal configuration input coupling coefficient will tend to decrease.

Coupling probe 16 is coupled to the center of accumulator cavity 10. Probe 16 is coupled to cavity 10 to extract energy therefrom. Factors such as the depth of penetration of probe 16 within cavity 10 and the size and shape of probe 16 will affect the magnitude of the output coupling coefficient $\beta_2$. Coupling probe 16 couples energy from cavity 10 through coaxial connector 17 to an external load.

In accordance with the teachings set forth to this point, input coupling coefficient $\beta_1$, as determined by the location of center conductor 113, and output coupling coefficient $\beta_2$, as determined by the penetration and shape of output coupling probe 16, have been selected so as to reduce the real part of the input impedance into acccumulator cavity 10 at the desired modal resonant frequency.

Cavity 13 has been properly coupled to input circuit 11 and spaced from accumulator cavity 10 so as to effectively further reduce the real part of the input impedance of cavity 10 to a value less than $Z_o$, the value of stabilizing load 112 which terminates input circuit 11. This is achieved by spacing secondary cavity 13 so as to effectively place a virtual short circuit across input circuit 11 at the top wall of accumulator cavity 10. The spacing between cavities 10 and 13 is designed to be the electrical equivalent of a quarter wavelength at the desired modal resonant frequency. The actual impedance and physical length of the section 116 coupling cavity 10 and 13 has been determined by equations (10) and (11) so as to minimize discontinuities derived in coupling the two cavities 10 and 13 to input circuit 11.

The effect of the adjustment of input and output coupling coefficients $\beta_1$ and $\beta_2$ and the placement of secondary cavity 13 results in the real part of the input impedance of the two cavities being minimized to a value less than $Z_o$. This is true at the desired modal frequency. Undesired modal frequency impedances will be effectively maximized. Active device 15, which may be a negative resistance energy source, such as an IMPATT diode, is coupled to input circuit 11 through the equalizing network comprised of center conductor 117 and dielectric support medium 118. This equalizing network provides a characteristic impedance at the input plane to accumulator cavity 10 which is directly proportional to the impedance at the output plane of active device 15. This direct proportionality of impedances is achieved by application of equations (13) and (14).

It should be further noted that the relationship between the input coupling coefficient $\beta_{1s}$ of secondary cavity 13 has been chosen to be significantly larger than the input coupling coefficient $\beta_1$ of accumulator cavity 10, in accordance with the teachings of equations (1) through (8), to provide means for achieving the necessary high output coupling coefficient $\beta_2$ from accumulator cavity 10 when a plurality of active devices 15 are employed and the invention is utilized as a power combiner. The manner in which power combination may be achieved is illustrated in FIG. 12 in which two input circuits 11 each with an active energy source 15 are illustrated.

The performance of the device is optimized by provision for fine tuning each cavity. The introduction of a tuning device must affect the modal structure symmetrically or else the desired model will be detrimentally affected and possibly destroyed. With the $TM_{020}$ mode selected for exposition of the invention herein, the only possible symmetrical location for a tuner is at the center of the cylindrical cavity. Since output coupling probe 16 is already coaxially located in accumulator cavity 10, this factor would seem to preclude the opportunity of locating means for fine tuning cavity 10. The arrangement suggested in FIGS. 11 through 13, however, obviate the problem. A depth adjustable tuning device 18 is located in the top wall of cavity 13. Coaxial with tuning device 18 is a dielectric rod 19 which passes through tuner 18 and is coupled to tuning mechanism 20 in the top wall of accumulator cavity 10. This arrangement permits both coaxial output coupling and coaxial tuning of a single, internal, resonant cavity such as is cavity 10 in the embodiment of FIG. 11. Dielectric rod 19 is utilized to establish to depth of penetration of tuning mechanism 20 in cavity 10.

As FIG. 12 illustrates and this disclosure teaches the invention may be used for combining the output of a plurality of active devices. As equation (4) points out the output coupling coefficient increases as the number of active devices to be combined are added to the structure. Typically output coupling is increased by increasing the depth of penetration of output coupling probe 16 into cavity 10. Although this tended to shift the modal resonant frequency of the cavity, such frequency shift tendancy could be compensated by adjustment of tuning mechanism 20. However in the present invention the height of cavity 10 has been constrained to permit a high input coupling coefficient $\beta_{1s}$ to secondary cavity 13. Thus, to avoid problems in achieving a tight output coupling coefficient as the number of active devices to be combined is increased, the structural configuration of output coupling probe 16 of FIG. 11 is modified to that of output coupling probe 161 of FIG. 13. In the structure of FIG. 13 coupling probe 161 tapers from a relatively high characteristic impedance to a relatively low characteristic impedance at the end of the probe. A linear taper is utilized in matching the high to low impedance sections of the probe. The output coupling coefficient $\beta_2$ is determined by the ratio of the high to low level impedances as set out in the following equation:

$$\beta_2 = f[(Z_H/Z_L)^2] \quad (16)$$

Since $\beta_2$ is a function of the square of the impedance ratio of the output probe, output coupling coefficient $\beta_2$ may be selected in accordance with this impedance ratio and not in dependence upon depth of penetration of the probe. Indeed, fine tuning of cavity 10 may be achieved by adjusting probe penetration.

In practicing the teachings set forth herein an efficient higher order mode resonant combiner was achieved in which twelve GaAs IMPATT diodes were combined so as to generate 17 watts of average power at $K_u$-Band with a 16.7 percent duty factor under injection locked conditions. The concepts set forth herein may be extended to greater pluralities of active devices. The number of such active devices to be combined after the manner suggested in FIG. 12, is unlimited. Size constraints are aleviated because of the ability to select higher and higher order mode resonant operation. As higher order modes are selected greater surface area becomes available for combining additional active devices. Although this disclosure presents an embodiment utilizing the $TM_{020}$ mode the techniques herein may be applied to any $TM_{0n0}$ mode.

What I have disclosed in an efficient higher order mode resonant combiner in which a higher order mode accumulator cavity is adjusted to have the real part of its input characteristic impedance to be so minimized as to be less than the characteristic impedance $Z_o$ of the input circuit. When an active device is matched to this low, minimized value of cavity input impedance a mismatch results between the active device power source and the input to the combiner at undesired higher order modal frequencies. This resultant mismatch at undesired modal resonances obviates the need for model suppression devices within the cavity which devices as taught in the prior art had detrimental effect of the efficiency of the combiner. The input impedance at the desired modal resonant frequency is minimized by choice of input and output coupling coefficients and by utilization of a secondary resonant cavity spaced a predetermined distance from the primary accumulator cavity so as to present a virtual short circuit across the input line above said primary accumulator cavity so as to virtually eliminate the effect of a terminating stabilizing load, $Z_o$, in the output circuit.

Those skilled in the art will conceive of other embodiments of the invention which embodiments nevertheless fall within the spirit and scope of the invention as sought to be protected by the claims appended hereto.

Having described my invention in a clear and concise manner in the foregoing specification and the accompanying drawing that those skilled in the art may readily and simply practice it, that which I claim is:

1. In a higher order mode resonance combiner comprising a first higher order mode resonant cavity; an input circuit terminated in a stabilizing load of value $Z_o$; input coupling means for coupling energy from said input circuit to said first resonant cavity; and output coupling means for extracting energy from said first cavity, the improvement comprising:
   first means for reducing the real part, $R_{in}$, of the input impedance, $Z_{in}$, of said higher order mode resonance combiner; and
   second means for further reducing said $R_{in}$ to a value less than $Z_o$ such that at a selected modal resonant frequency, $f_o$, $R_{in}$ shall be minimized.

2. The combiner of claim 1 wherein said first means for reducing the real part $R_{in}$ of said input impedance comprise means for selectively establishing the magnitudes of the input coupling coefficient $\beta_1$ of said input coupling means, and the output coupling coefficient $\beta_2$ of said output coupling means, the relationship of said $\beta_1$ to said $\beta_2$ being selected to reduce said $R_{in}$ at said selected modal resonant frequency $f_o$.

3. The combiner of claim 1 or 2 wherein said second means for further reducing said $R_{in}$ to a value less than $Z_o$ comprise a second higher order mode resonant cavity so spaced from said first resonant cavity as to present a virtual short circuit in the vacinity of said input coupling means and so as to inhibit the passage of energy beyond said input coupling means of said first resonant cavity.

4. The combiner of claim 3 wherein said input circuit comprises a coaxial circuit coupled to an energy source and to said stabilizing termination.

5. The combiner of claim 4 wherein said coaxial circuit further comprises equalizing network means for making the input impedance of said input circuit directly proportional to the output impedance of said energy source.

6. The combiner of claim 5 wherein said energy source comprises a negative resistance device.

7. The combiner of claim 6 wherein said negative resistance device is an IMPATT diode or Gunn diode.

8. The combiner of claim 1 wherein said output coupling means further comprises means for coupling selectively to one of several higher order mode field configurations within said first resonant cavity.

9. The combiner of claim 5 wherein said coaxial circuit further comprises second input coupling means for coupling said coaxial circuit to said second resonant cavity.

10. The combiner of claim 9 wherein said coaxial circuit further comprises second impedance transformation means to reduce discontinuity effects of coupling said coaxial circuit to said first and said second resonant cavities and reduce losses in said stabilizing termination.

11. The combiner of claim 10 wherein said second input coupling means further comprise means for selectively establishing the magnitude of the input coupling coefficient $\beta_{1s}$ of said second input coupling means, the relationship of said $\beta_{1s}$ to said $\beta_1$ being selected to achieve a high output coupling coefficient $\beta_2$.

12. The combiner of claim 11 wherein said means for selectively establising the magnitude of $\beta_{1s}$ comprises means for establishing the height of said second resonant cavity, the relationship of the height of said second resonant cavity with respect to the height of said first resonant cavity determining the relationship between $\beta_{1s}$ and $\beta_1$.

13. The combiner circuit of claim 3 further comprising first tuning means for tuning said first resonant cavity without detriment to the selected higher order mode of resonance.

14. The combiner of claim 13 wherein said selected higher order mode of resonance is the $TM_{020}$ mode and said first tuning means is a depth adjustable, coaxially located tuning probe.

15. The combiner of claim 14 further comprising second tuning means for tuning said second resonant cavity without detriment to the selected higher order mode of resonance.

16. The combiner of claim 15 wherein said selected higher order mode of resonance is the $TM_{020}$ mode and said second tuning means is a depth adjustable, coaxially located tuning probe.

17. The combiner of claim 16 further comprising means for individually adjusting the depth of each of said first and second tuning probes, said means for adjusting said first tuning probe being coupled thereto through said second tuning probe.

18. The combiner of claim 2 wherein said means for selectively establishing the magnitude of said output coupling coefficient $\beta_2$ comprises a depth adjustable output coupling probe.

19. The combiner of claim 18 wherein said output coupling probe is a tapered probe coupled to the conductor of an output transmission line, said taper introducing a variation of impedance from a low value at the end of the probe to a high value at the conductor of the output transmission line such that the magnitude of $\beta_2$ is a function of the square of the ratio of the high to the low impedance values.

20. The combiner of claim 2 wherein said means for selectively establishing the magnitude of said output coupling coefficient $\beta_2$ comprises a tapered output coupling probe coupled to the conductor of an output transmission line, said taper introducing a variation of impedance from a low value at the end of the probe to a high value at the conductor of the output transmission line such that the magnitude of $\beta_2$ is a function of the square of the ratio of the high to the low impedance values.

21. The combiner of claim 12 wherein said input coupling means comprises a plurality of said coaxial circuits each coupled to an energy source and to a stabilizing termination.

22. The combiner of claim 21 further comprising means for selecting said higher order mode of resonant operation of said first and second resonant cavities to provide a resonant cavity of sufficient surface area for coupling to said plurality of said coaxial circuits.

* * * * *